(12) United States Patent
Nastasoiu et al.

(10) Patent No.: US 8,046,197 B2
(45) Date of Patent: Oct. 25, 2011

(54) METHOD OF DESIGNING A JOINT OF ADJACENT COMPONENTS TO MINIMIZE A PERCEIVED GAP AND ALGORITHM FOR A COMPUTER-AIDED MODELING SYSTEM

(75) Inventors: Ion J. Nastasoiu, Rochester Hills, MI (US); Manuela C. Nastasoiu, Rochester Hills, MI (US)

(73) Assignee: GM Global Technology Operations LLC, Detriot, MI (US)

( * ) Notice: Subject to any disclaimer, the term of this patent is extended or adjusted under 35 U.S.C. 154(b) by 486 days.

(21) Appl. No.: 12/245,818

(22) Filed: Oct. 6, 2008

(65) Prior Publication Data

US 2010/0088069 A1    Apr. 8, 2010

(51) Int. Cl.
*G06F 17/50* (2006.01)
*G06F 19/00* (2011.01)

(52) U.S. Cl. ............ 703/1; 700/97; 700/98; 700/103

(58) Field of Classification Search ...... 703/1; 296/187, 296/193; 29/509; 156/216; 180/69 R; 700/97, 700/98, 103
See application file for complete search history.

(56) References Cited

U.S. PATENT DOCUMENTS

| | | | | |
|---|---|---|---|---|
| 5,608,817 | A * | 3/1997 | Yamaoka et al. | 382/152 |
| 5,619,587 | A * | 4/1997 | Willoughby et al. | 382/141 |
| 5,772,288 | A * | 6/1998 | Cvijanovic | 301/63.105 |
| 6,338,000 | B1 * | 1/2002 | Nakajima et al. | 700/97 |
| 6,907,763 | B2 * | 6/2005 | Baulier | 72/312 |
| 7,038,700 | B2 * | 5/2006 | Kawaguchi et al. | 345/646 |

\* cited by examiner

*Primary Examiner* — Jason Proctor
*Assistant Examiner* — Cedric D Johnson
(74) *Attorney, Agent, or Firm* — Quinn Law Group, PLLC

(57) ABSTRACT

A method of designing adjacent components is provided that results in a minimum "perceived gap" between the components, i.e., a minimum total distance between a change in curvature of the first component at the gap and a change in curvature of the second component at the gap.

12 Claims, 5 Drawing Sheets

US 8,046,197 B2

METHOD OF DESIGNING A JOINT OF ADJACENT COMPONENTS TO MINIMIZE A PERCEIVED GAP AND ALGORITHM FOR A COMPUTER-AIDED MODELING SYSTEM

TECHNICAL FIELD

The invention relates to a method of designing components, such as vehicle body panels. The method may be implemented as an algorithm in a computer-aided modeling system.

BACKGROUND OF THE INVENTION

A vehicle is a complex assembly of hundreds of components. Many of these components are visible on the exterior or interior of the vehicle. Components adjacent one another may be closely spaced, forming a joint between the components. For example, the body side outer components of the vehicle, such as the fender and the body side outer at the base of the A-pillar form a joint with a visible gap.

The appearance of the gaps between adjacent components affects the perceived quality of the vehicle. For optimal aesthetics and a "tailored" appearance, the gaps should appear to be as small as possible. Additionally, if any of the gaps appear to vary in size, perceived quality may be lower. Competing factors, such as assembly build variations (i.e., assembly stack-up tolerances), and component manufacturing, such as a potential die lock when forming the component, may require that a gap be larger than aesthetics alone would dictate. Typically, vehicle manufacturers do not have a consistent methodology for minimizing the appearance of gaps when designing adjacent vehicle components.

SUMMARY OF THE INVENTION

A procedure for designing components, especially vehicle components, which will result in an optimal joint between adjacent components is desired. Accordingly, a method of designing adjacent components is provided that results in a minimum "perceived gap" between the components. The method is based on a determination that the perceived quality depends not just on the actual size of the gap, but on the total distance between a change in curvature of the first component at the gap and a change in curvature of the second component at the gap. This distance may be referred to as the "perceived gap", and is larger than the actual gap. The change in curvature creates a shadow adjacent the gap. Thus, when viewed from a distance, the actual gap is perceived to be larger due to the reflection of light off of the components creating a shadow between the change in curvature of the first and second components.

Based on this knowledge, a method of designing adjacent components includes selecting input values for the components and the joint formed by the components. These input values include a first radius r of a first blending surface of a first vehicle component (also referred to as a first portion of a first vehicle component), a second radius R of a second blending surface of a second component, a minimum clearance C between the first and second components at an end of a first flange with a first length l of the first component extending from the first blending surface of the first vehicle component, a second flange with a second length L of the second vehicle component extending from the second blending surface of the second vehicle component (also referred to as a second portion of the second vehicle component), and a gap G between the first and second components. The first and second vehicle components are partially defined by geometric characteristics of a predetermined outer surface. For vehicle components, this may be referred to as a "class A" surface, and is typically an outer surface of the components. A predetermined curve coincident with the outer surface, and may be referred to as a "cut line", is the location at which the joint will be formed.

A first angle of the first flange of the first component relative to a line perpendicular to the outer surface is calculated based on at least some of the selected input values and geometric characteristics. The first angle has a value:

$180 - \epsilon - \delta$.

(The values of $\epsilon$ and $\delta$ are discussed below.) A second angle of the second flange of the second component relative to the same line perpendicular to the outer surface is also calculated based on at least some of the selected input values and geometric characteristics, the second angle being:

$180 - \epsilon$.

Angle $\epsilon$ is the angle between the outer surface and a line that unites the centers of the first and second blending surfaces of the first and second components, and has a value of:

$\arcsin((R-r)/(r+G+R))$.

The second flange extends tangent from the second blending surface of the second vehicle component, and when it is perpendicular on the line that unites the centers of the first and second blending surfaces of the first and second components, then the "perceived gap" has the smallest size possible. The first flange extends tangent from the first blending surface of the first component and it forms an angle $\delta$ relative to the second flange of the second vehicle component in order to maintain for its own first length l a minimum clearance C to the second flange of the second vehicle component. The angle $\delta$ may be:

$\arctan(r/l) - \arcsin((r+G-C)/\mathrm{sqrt}(l^2+r^2))$.

In another embodiment, the given geometrical elements of the joint are: an outer surface; a curve coincident with the outer surface; a first radius r of a first blending surface of the first vehicle component; a second radius R of a second blending surface of the second vehicle component, the second radius R being greater than the first radius r; a required gap G between the first and second vehicle components; a first length l of a first flange of the first vehicle component extending from the first blending surface of the first vehicle component; a second length L of a second flange of the second vehicle component extending from the second blending surface of the second vehicle component; and a required minimum clearance C between the first flange of the first vehicle component at a distal end thereof and the second flange of the second vehicle component.

The method to develop the two-dimensional lines of the first and second components (i.e., line segments representing portions of a cross-section of the components, with the components being represented as two-dimensional, without thickness in cross-section) is described below, and is used to study the behavior of the joint. The thickness of the components does not affect the perceived gap. Likewise, thickness of any paint applied to the components does not affect the perceived gap. The method includes establishing a first offset curve at which the curvature of the first vehicle component changes by offsetting by the first radius r from the curve coincident with the outer surface along the outer surface. A center of the first blending surface of the first vehicle component is then determined in a second step by extending a first line segment with a length equal to the value of the first radius r perpendicular to the outer surface at the first offset curve, with the end of the first line segment opposite the first offset curve being the center of the first blending surface of the first vehicle component. Next, in a third step, a line segment of first length l is extended from the center of the first blending surface of the first vehicle component at the first angle with respect to the line perpendicular to the outer surface. The first angle has a value:

(180−ϵ−δ).

A first flange of the first vehicle component is then created in a fourth step, by offsetting the line segment of length l by the first radius r. In a fifth step, the outer surface and first flange of the first component are then "blended" (i.e., a fillet for two-dimensional lines) by radius r.

To build the second flange of the second vehicle component, in a sixth step, a line segment of length L is constructed extending from the center of the first blending surface of the first vehicle component at the second angle from the first line segment established in the second step. The second angle has a value (180−ϵ). Next, in a seventh step, the line segment of length L is offset from the line segment constructed in the sixth step by a distance:

r+G;

to thereby establish the second flange of the second vehicle component. In an eighth step, the outer surface is "blended" (i.e., a fillet for two-dimensional lines) with the second flange to complete the second vehicle component.

By implementing the method, the second flange will be perpendicular on the line that unites the centers of first and second blending surfaces of the first and second vehicle components, and the resulting distance between the tangents of the first and second blending surfaces of the first and second vehicle components with the outer surface (i.e., the perceived gap) is the minimum achieved to satisfy the selected first radius r, the selected second radius R, the selected third distance G, the selected fourth distance C, and the selected fifth distance l.

The method may be implemented as an algorithm for a computer-aided modeling system, with the algorithm contained in a computer readable storage medium. First, the computer receives selected spatial data for an outer surface partially defined by the first and second vehicle components, a predetermined curve coincident with the outer surface, a selected first radius r of a first blending surface of the first vehicle component, a second radius R of a second blending surface of the second vehicle component, the second radius R being greater than the first radius r, a required gap G between the first and second vehicle components, a first length l of a first flange of the first vehicle component extending from the first blending surface of the first vehicle component, a second length L of a second flange of the second vehicle component extending from the second blending surface of the second vehicle component, a required minimum clearance C between the first flange of the first vehicle component at a distal end thereof and the second flange of the second vehicle component. Next, the algorithm offsets by the value of the first radius r from the predetermined curve coincident with the outer surface along the outer surface to establish a first offset curve. A first surface is then created that extends perpendicularly to the outer surface at the first offset curve with a length equal to the first radius r. Additionally, a second surface with the first length l is created at the following angle to the first surface:

180−ϵ−δ.

A third surface, which is the first flange of the first vehicle component is created by offsetting the second surface by the distance of first radius r. The outer and third surfaces are then blended with a blend radius equal to the first radius r, to thereby complete the design of the first vehicle component. A "blend radius" is the radius of a surface connecting (i.e., blending) two other surfaces. A fourth surface with the second length L is then created through the center of the first blending surface of the first vehicle component at the following angle from the first surface:

180−ϵ.

A fifth surface, which is the second flange of the second vehicle component, is then created by offsetting the fourth surface by the sum of the first radius r and the first required gap G from the fourth surface. The outer and the fifth surfaces are then blended with second radius R to thereby complete the design of the second vehicle component. The components form a joint satisfying the selected first radius r, second radius R, gap G, required minimum clearance C, first length l, and second length L.

If just the second angle (180−ϵ) of the second flange of the second component is decreased, then the perceived gap will be larger than the one resulting from the method above. However, manufacturing considerations such as die lock or formability requirements may require such a modification. When the method is implemented as a computer aided modeling system, any or all of the input variables such as the first radius r, the length l, etc., may be changed, and the the resulting joint design will be updated.

As an alternative option to design the first and second flanges of the first and second vehicle components, and achieve the same geometry of the first and second components as in the method described above, the sketch operator (a computer-aided design tool know to those skilled in the art) could be used. Using the sketch operator on a datum plane, the two-dimensional lines and curves will be developed. All of these two-dimensional lines and curves are connected to each other by geometric and dimensional constraints. In order to have the true lengths for the first and second flanges of the first and second vehicle components, the datum plane must be perpendicular on the "cut line" (note that a cut line is a curve, not a line, and is not contained in the datum plane).

First, this method of designing the first and second components includes creating a datum plane which must be perpendicular anywhere along the cut line. Second, using this datum plane, the outer surface and the curve coincident with the outer surface (i.e., cut line) will be sectioned, resulting in an outer surface curve, and a cut line point, respectively. Third, this outer surface curve will be trimmed with the cut line point. Fourth, the total length of the outer surface curve will be made equal with the first radius r. The following lines will be created on the datum plane and they will start with the curve obtained out of the outer surface curve after it was trimmed. Fifth, a line segment of length r perpendicular to the outer surface curve and extending from the end of the trimmed outer surface curve with the length r will be created. Sixth, a line segment of length l is then created at an angle with the line segment of length r created in the fifth step, the angle having the value:

180−ϵ−δ.

Seventh, a line segment of length r is created perpendicular to the end of the line segment created in the sixth step. Eighth, a line segment of length 2l is created extending back toward the outer surface sixth curve from the end of the line segment created in the seventh step.

To design the second vehicle component, the first five steps used to design the first vehicle component are also utilized to begin the design of the second vehicle component. Ninth, a line segment of length L is created extending from the end of the second line segment sketched at an angle with respect to the fifth line segment of:

$$180-\epsilon.$$

Tenth, a line segment with a length:

$$r+G$$

is then created perpendicular from the ninth line segment. Finely, an eleventh line segment of length 2L is then created perpendicular to the tenth line segment of length r+G. The line segments of the lengths 2l and 2L are then swept along the cut line maintaining the same relative 90 degree angle to the outer surface as established in the two-dimensional sketch. By sweeping the line segment 2l along the cut line, the first flange surface of the first vehicle component will be created. By blending this first flange surface with the outer surface by the first radius r, the first vehicle component is created. Similar, by sweeping the line segment 2L along the cut line, the second flange surface of the second vehicle component will be created. By blending this second flange surface with the outer surface by the second radius R, the second vehicle component is created.

The above features and advantages and other features and advantages of the present invention are readily apparent from the following detailed description of the best modes for carrying out the invention when taken in connection with the accompanying drawings.

DESCRIPTION OF THE PREFERRED EMBODIMENTS

Figure 1:
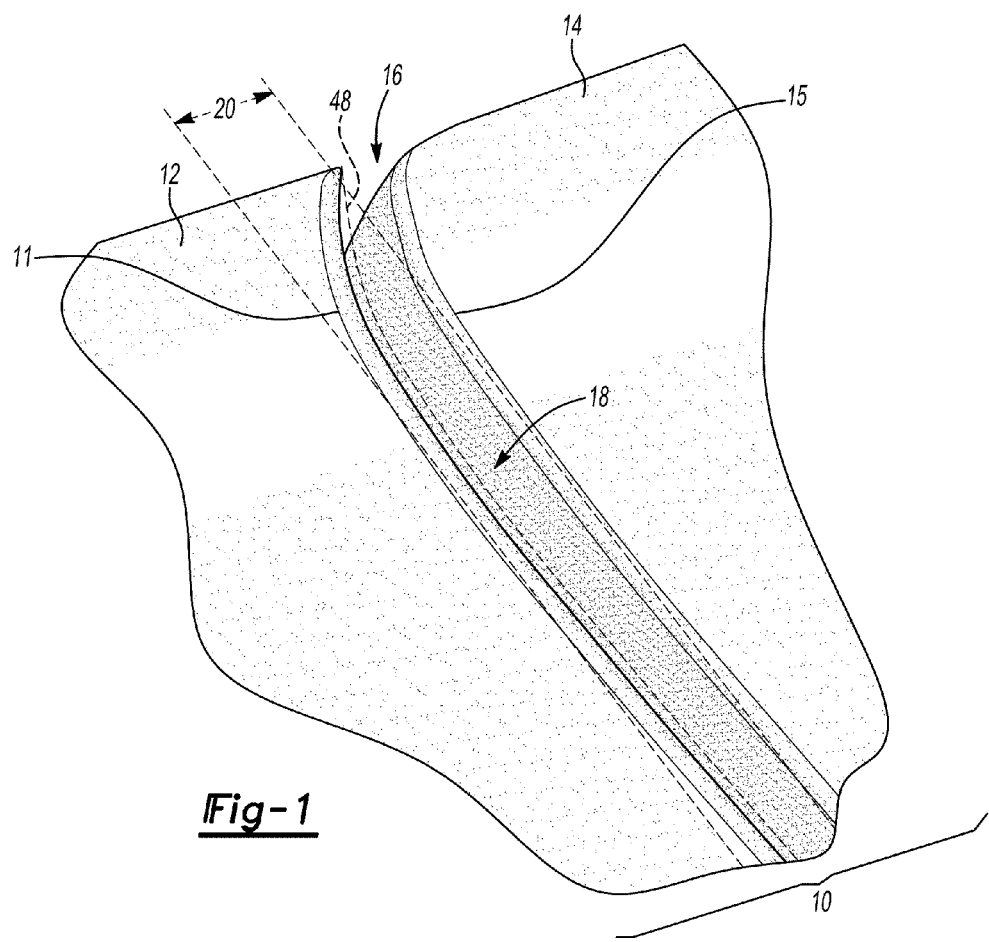
FIG. 1 is a schematic perspective illustration of a first vehicle component and a second vehicle component forming a joint and illustrating a perceived gap.

Referring to the drawings, wherein like reference numbers refer to like components throughout the several views, FIG. 1 shows a portion of a vehicle 10 with a first component 12 and a second component 14 adjacent to the first component to form a joint 16. As used herein, a "joint" is the configuration of two components where they are adjacent one another, and does not imply or require that the components are joined to one another at the joint. FIG. 1 illustrates that there is an actual gap 18 between the two components 12, 14. There is also a perceived gap 20 that extends from a change in curvature 11 of the first component 12 to a change in curvature 15 of the second component 14, as best illustrated in and described below with respect to FIG. 3. The reflection of light off the surfaces of the components 12, 14 often causes the area adjacent the actual gap 18 to be darker than relatively flat portions of the components 12, 14, so that the perceived gap 20 appears larger than the actual gap 18, as best illustrated in FIG. 3.

Figure 2:
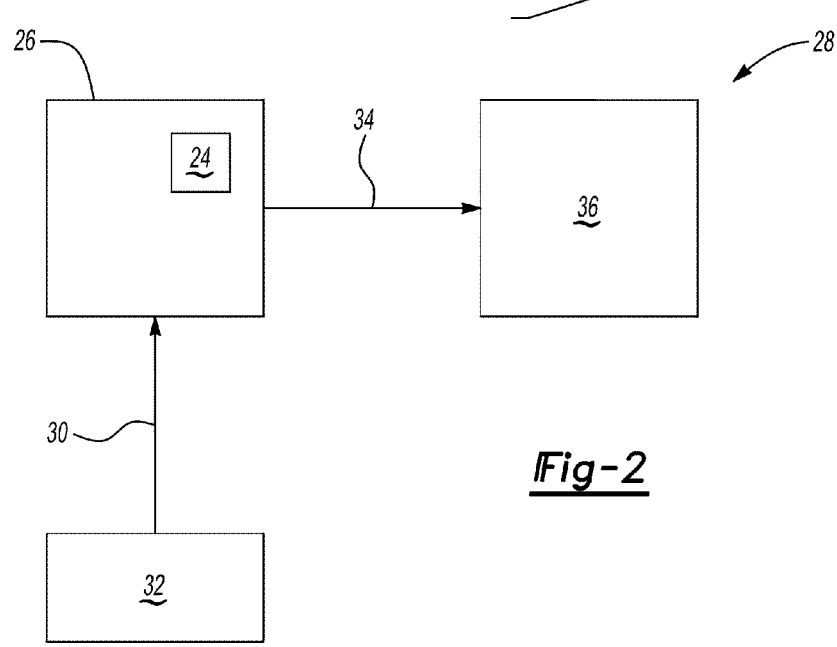
FIG. 2 is a schematic illustration of a computer-aided modeling system.
Figure 9:
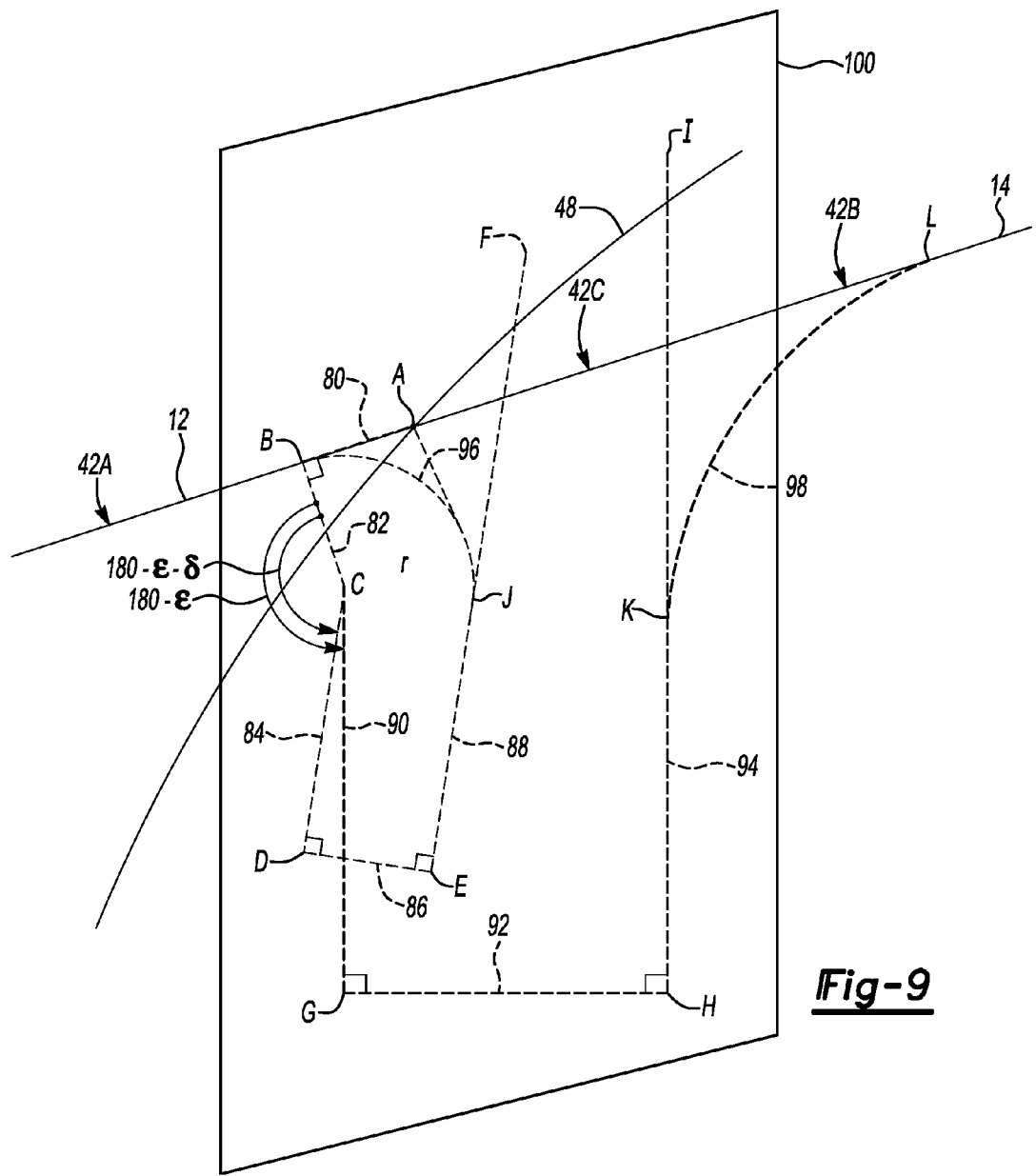
FIG. 9 is a schematic illustration of an alternative option to design the first and second vehicle components of FIG. 1 by using a sketch operator, with the method being stored as an algorithm in the computer-aided modeling systems of FIG. 2.
Figure 8:
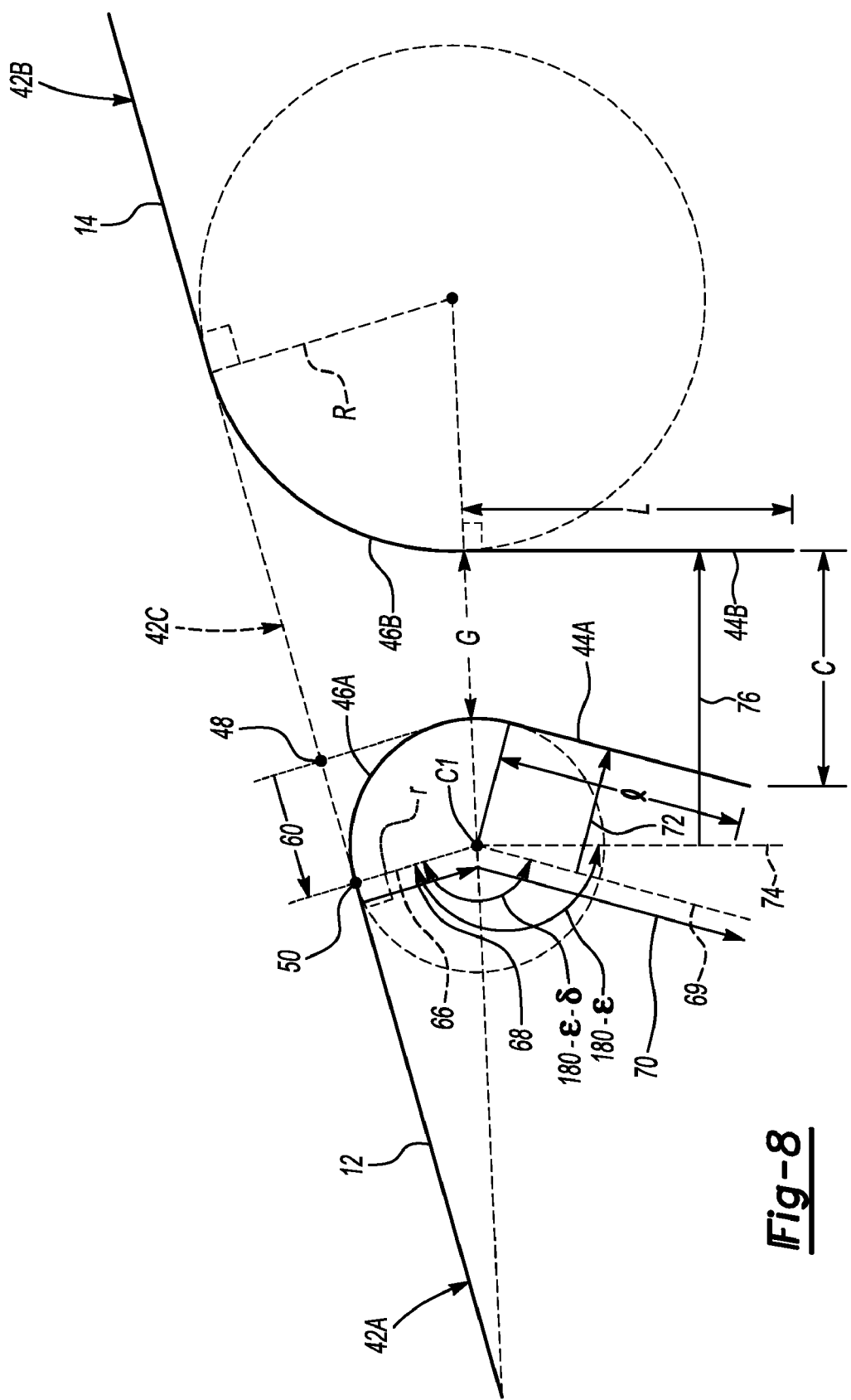
FIG. 8 is a schematic illustration of the first and second vehicle components of FIG. 1 designed according to the method described with respect to FIG. 3, and illustrating surfaces established according to the algorithm, with the method being stored as an algorithm in the computer-aided modeling system of FIG. 2.

Methods of designing the vehicle components 12, 14 that result in a minimum perceived gap are provided and described with respect to FIGS. 8 and 9. The methods described with respect to FIG. 8 and FIG. 9 may be stored on a computer readable storage medium, i.e., as an algorithm 24 in a computer processor 26 of computer-aided modeling system 28 of FIG. 2. Input data or information 30 is received by the computer processor 26 from an input device, such as a keyboard 32. The input data 30 is processed according to the algorithm 24. Output results 34 are then displayed on a visual screen 36 to enable a user to see an image of the vehicle components 12, 14 as designed according to the method.

Figure 3:
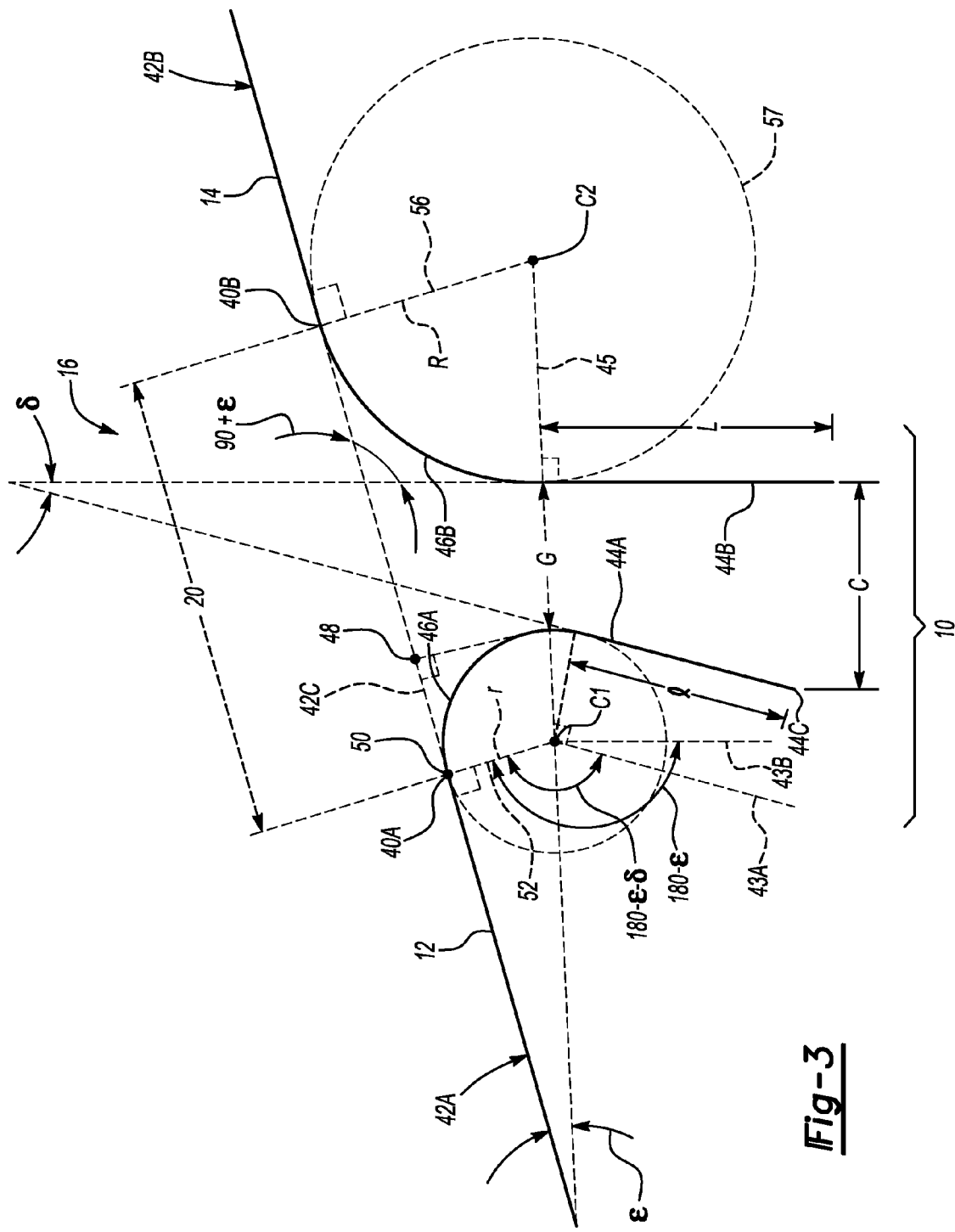
FIG. 3 is a schematic illustration of the two-dimensional development joint lines in order to design the first and second vehicle components of FIG. 1 to minimize the perceived gap of FIG. 1.

Referring to FIG. 3, the joint 16 is formed between the first and second vehicle components 12, 14 while maintaining a gap G necessitated by the dimensional technical specification, manufacturing limitations, or build variation of the components 12, 14 or in other components that may be adjacent or may connect with either one of the components 12, 14. The perceived gap 20 is measured from a change in curvature 40A along a geometric outer surface 42A (represented in two-dimension as an outer surface curve) of component 12 to a change in curvature 40B along a geometric outer surface 42B (represented in two-dimension as an outer surface curve) of component 14. Considering that a radius r of a first blending surface 46A of the first component 12 is smaller than a radius R of a second blending surface 46B of the second component 14, and maintaining the gap G between the components 12, 14 as well as maintaining the radii r, R, at their closest vicinity to one another and also considering that the second flange 44B is perpendicular on the line 45, that unites the centers of the first and second blending surfaces 46A, 46B of the first and second vehicle components 12, 14, then the perceived gap 20 will achieve the smallest size possible. The line segment 45 has a length:

$$r+G+R$$

The perceived gap 20 shown is the optimal, most aesthetically-pleasing gap (i.e., the smallest perceived gap that satisfies the radii r, R and gap G), and it cannot be reduced more than that by further reducing the angle of the second flange 44B to outer surface from that shown in FIG. 3. The angle is referred to as a second flange angle to outer surface and has a value:

$$90+\epsilon;$$

with a value of $\epsilon$ further described below.

If the second flange angle to outer surface 90+$\epsilon$ is decreased, and the second flange 44B therefore extends at less than a 90 degree angle from the line segment 45 (i.e., the terminal end of second flange 44B tips to the right in FIG. 3), the second blending surface 46B does not change in position.

Thus, the change in curvature 40B does not move along outer surface 42B. It is recognized that if the angle between the outer surface 42A, 42B, 42C and the second flange 44B of the second component 14 is increased over 90+ϵ the change in curvature 40B of the second component 14 will move to the right in FIG. 3 along outer surface 42A, 42B, 42C thereby increasing the perceived gap 20.

Accordingly, understanding that the center C1 of the first blending surface 46A is at a distance r from the change in curvature 40A perpendicular from the outer surface 42A, the center C2 of the second blending surface 46B is a distance R from the change in curvature 40B perpendicular to the outer surface 42B, the gap is a distance between the first and second vehicle components, and the second flange 44B extends perpendicular to the line segment 45 joining the centers C1, C2, it can be determined that an angle ϵ formed by a line through the centers C1, C2 (i.e., a line including line segment 45) and the outer surface 42A, 42 B, 42C has a value:

$$\arcsin((R-r)/(r+G+R)).$$

With a further limitation of a minimum clearance C measured from an end 44C of the first flange 44A perpendicular to the second flange 44B and knowing the length l of the first flange 44A, an angle δ between the first flange 44A of the first component 12 and the second flange 44B of the second component 14 has a value:

$$\arctan(r/l)-\arcsin((r+G-C)/\sqrt{l^2+r^2})).$$

Finally, geometric principles dictate that the minimum perceived gap 20 resulting from designing the first and second components 12, 14, respectively, in this manner has a value:

$$(r+G+R)*\cos(\arcsin((R-r)/(r+G+R))).$$

With the above formula for the minimum perceived gap 20 that is based on the given predetermined radii r, R, and a required gap G, and the values of the angles ϵ and δ, a method can be utilized to consistently determine the minimum perceived gap 20. Specifically, a method of creating the developing lines for the components 12, 14 begins with selecting input values for the first radius r of the first blending surface 46A of the first vehicle component 12, the second radius R of the second blending surface 46B of the second vehicle component 14, the minimum clearance C between the first vehicle components 12 at an end 44C of the first flange 44A extending from the first blending surface 46A of the first vehicle component 12 to the second flange 44B of the second vehicle component, the gap G between the first and second vehicle components 12, 14, the first length l of the first flange 44A of the first vehicle component 12 and the second length L of the second flange 44B of the second vehicle component 14.

Geometric characteristics, such as spatial shape, of a predetermined outer surface that is partially defined by the first and second components are provided. In FIG. 3, the predetermined outer surface includes the outer surfaces 42A, 42B and, prior to forming the joint 16, initially is defined also by outer surface portion 42C extending between these outer surfaces 42A, 42B to form a contiguous outer surface 42A, 42B, 42C. The outer surface 42A, 42B, 42C is predetermined in that it is decided upon as a studio design theme prior to finalizing the design of the joint 16. A predetermined curve 50 (i.e., the cut line) coincident with the outer surface 42A, 42B, 42C is also a given input parameter.

Next, a first angle of the first flange 44A of the first component 12 relative to a line 52 that is perpendicular to the outer surface 42A is calculated based on at least some of the selected input values and geometric characteristics. The first angle is shown in FIG. 3 between a line 52 perpendicular to outer surface 42A and a line 43A parallel to first flange 44A. Specifically, the first angle has the value:

$$180-\epsilon-\delta;$$

which is:

$$180-\arcsin((R-r)/(r+G+R))-\arctan(r/l)+\arcsin((r+G-C)/\sqrt{l^2+r^2})).$$

Additionally, a second angle of the second flange 44B of the second component 14 relative to the line 52 that is perpendicular to the outer surface 42A is calculated based on at least some of the selected input values and geometric characteristics. The second flange 44B extends from the second blending surface 46B of the second component 14. The second angle is shown in FIG. 3 between a line 52 perpendicular to outer surface 42A and a line 43B parallel to second flange 44B. Specifically, the second angle has the value:

$$180-\epsilon;$$

which is:

$$180-\arcsin((R-r)/(r+G+R)).$$

The calculated first and second angles minimize the perceived gap 20, which is the distance between points 40A, 40B on the outer surface 42A, 42B, 42C at which the first blending surface 46A and the second blending surface 46B of the first and second components 12, 14 are tangent to the outer surface 42A, 42B, 42C and converge at the respective radii r, R toward the gap G.

In order to create the developing lines of the first and second vehicle components 12, 14 according to the input information set forth above (i.e., the radii r, R, the required gap G, the length l of the first flange 44A of the first vehicle component 12, the length L of the second flange 44B of the second vehicle component 14 and the minimum clearance C) begin at the selected outer surface 42A, 42B, 42C, and then offset the predetermined curve coincident with outer surface 48 (i.e., moving along the outer surface 42A, 42B, 42C) by the first radius r to establish first offset curve 50 (see FIG. 3). In FIG. 3, the first offset curve 50 is coincident with the change in curvature 40A. Next, a second line segment 52 (shown in phantom in FIG. 3) with a length r is extended perpendicular to the outer surface 42A, 42B, 42C from the offset curve 50 to determine a center of the first blending surface 46A of the first component 12. The end of segment 52 is the center C1.

Next, from the center C1 relative to the second line segment 52, extend a third line segment 43A having the first length l at the first angle (i.e., angle with value 180-ϵ-δ). Then in the fourth step, offset this line segment 43A by the first radius r, which will create the first flange 44A of the first vehicle component 12. In the fifth step, between the outer surface 42A and the first flange of the first vehicle component 12, a fillet having the first radius r is created. The outer surface 42A, the fifth fillet having the first radius r, which is the first blending surface 46A, and the first flange 44A will actually define the first vehicle component 12.

In order to develop the lines for the second vehicle component 14, a sixth segment line 43B is created by extending a line from the center C1 having the second length L at the second angle (i.e., angle with value 180-ϵ) relative to the second line segment 52. Next, in the seventh step, the line segment 43B is offset by a distance of r+G, resulting in the second flange 44B. In the eighth step, between the outer surface 42B and the second flange 44B at the second vehicle component 14, a fillet having the second radius R is created (shown as a portion of circle 57). The outer surface 42B, the eighth fillet having the second radius R, which is the second blending surface 46B, and the second flange 44B with define the second vehicle component 14. The center C2 is thus positioned from outer surface 42B by line segment 56 having a length of the radius R.

Figure 4:
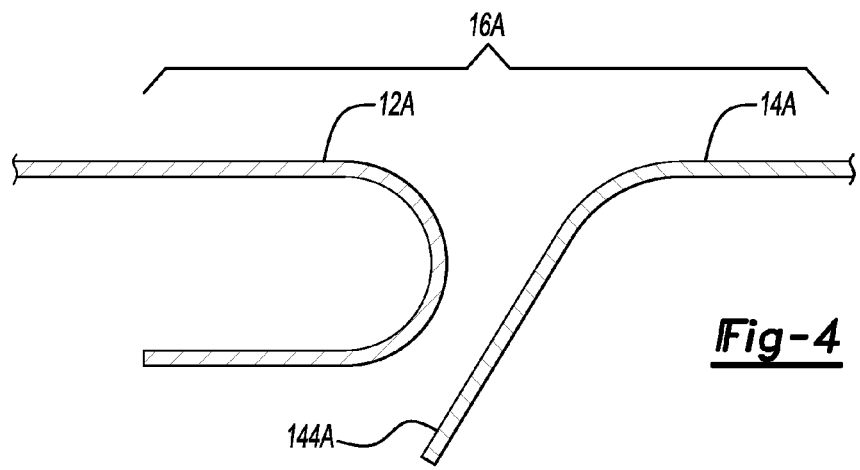
FIG. 4 is a schematic cross-sectional illustration of a second type of joint with a perceived gap that may be designed utilizing the method described with respect to FIG. 3.
Figure 5:
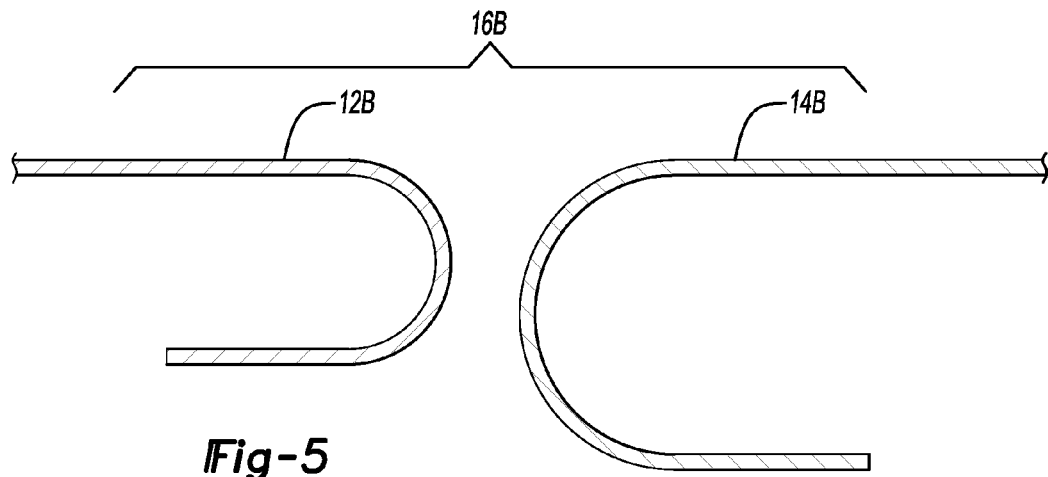
FIG. 5 is a schematic cross-sectional illustration of a third type of joint with a perceived gap that may be designed utilizing the method described with respect to FIG. 3.
Figure 6:
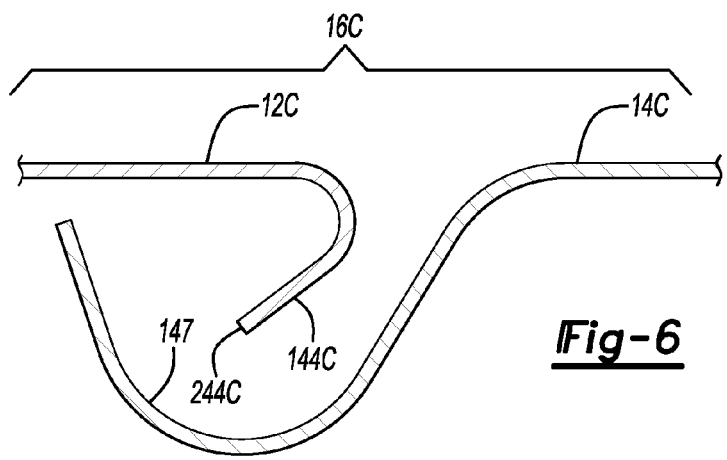
FIG. 6 is a schematic cross-sectional illustration of a fourth type of joint with a perceived gap that may be designed utilizing the method described with respect to FIG. 3.
Figure 7:
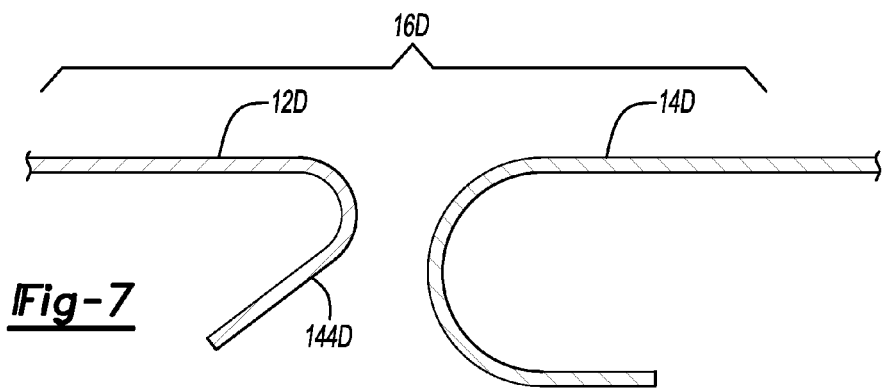
FIG. 7 is a schematic cross-sectional illustration of a fifth type of joint with a perceived gap that may be designed utilizing the method described with respect to FIG. 3.

The method of designing the joint 16 described above may also be applied to other types of joints, such as the joints 16A, 16B, 16C and 16D of FIGS. 4-7, respectively, to obtain the minimum perceived gap based on the selected input data. Specifically, joint 16A of FIG. 4 is a hem-to-flange joint, as component 12A is hemmed (i.e., curved or folded over) at the joint 16A while component 14A has a flange 144A. Joint 16B of FIG. 5 is a hem-to-hem joint, with both component 12B and component 14B hemmed at the joint 16B. Joint 16C of FIG. 6 is a flange-to-ditch joint, with component 12C having a flange 144C and component 14C having a ditch 147 equally spaced at a distance C to the flange 144C relative to the flange end 244C. Joint 16D of FIG. 7 is a flange-to-hem joint with the component 12D having the flange 144D and component 14D hemmed at the joint 16D (i.e., opposite to the arrangement of FIG. 4). To design these joints 16A-16D, the principals described above for the design of joint 16 may be followed, with the components then modified as necessary to form hems, ditches or flanges, respectively.

The method of designing components 12, 14 described above may be implemented by the computer-aided modeling system 28 and displayed on graphic display 36, with the series of steps utilized in configuring the components 12, 14. Specifically, the method of designing the components 12, 14 is described with respect to FIG. 8, which illustrates the components 12, 14 configured in the same manner as shown in FIG. 3. The processor 26 of FIG. 2 receives selected spatial data for the outer surface 42A, 42B, 42C, partially defined by the first and second vehicle components 12, 14, the predetermined curve coincident with the outer surface 48 (best shown in FIG. 1), the selected first radius r of the first blending surface 46A of the first component 12, the second radius R of the second blending surface 46B of the second component 14, the required gap G between the first and second vehicle components 12, 14, the first length l of the first flange 44A of the first vehicle component 12 extending from the first blending surface 46A, the second length L of the second flange 44B of the vehicle component 14 extending from the second blending surface 46B the required minimum clearance C between the first flange 44A of the first vehicle component 12 at a distal end thereof and the second flange 44B of the second vehicle component 14.

Next, as indicated by arrow 60, the algorithm 24 offsets by the value of the first radius r from the predetermined curve coincident with the outer surface 48, which is the cut line along the outer surface 42A, 42B, 42C to establish a first offset curve 50. The cut line 48 is a curve, not a line, and is not contained in the datum plane 100. The first offset curve 50 is visible only as a point in the side view of FIG. 8, but is identical to curve 48 (best shown in FIG. 1) but offset therefrom by a distance of radius r.

A first surface 66 is established extending perpendicularly to the outer surface 42A, 42B, 42C at the first offset curve 50 with a length equal to the first radius r, and with the center C1 of the first blending surface 46A of the first vehicle component 12 being at a distal end of the first surface 66. Establishment of first surface 66 relating from the first offset curve 50 is indicated by arrow 68.

A second surface 69 is then created at the first angle to the first surface 66, with the first length l, wherein the first angle is:

$$180-\epsilon-\delta;$$

which is:

$$180-\arcsin((R-r)/(r+G+R))-\arctan(r/l)+\arcsin((r+G-C)/\sqrt{l^2+r^2})).$$

Creation of the second surface 69 relating from first surface 66 is indicated by arrow 70.

The algorithm 24 then offsets by the first radius r to the second surface 69 to create a third surface 44A (i.e., first flange) with the length l. Offsetting by radius r is indicated by arrow 72.

Next, the outer surface 42A, 42B, 42C and the third surface 44A are blended with a blend radius equal to the first radius r. The blending of the outer surface 42A, 42B, 42C and the third surface 44A creates the first blending surface 46A.

A fourth surface 74 with the second length L is then created at the second angle from the first surface 66; wherein the second angle is:

$$180-\epsilon;$$

which is:

$$180-\arcsin((R-r)/(r+G+R)).$$

Next, as indicated by arrow 76, the algorithm 24 offsets by the value of the sum of the first radius r and the gap G from the fourth surface 74 to create a fifth surface 44B of length L parallel with the fourth surface 74. After the fifth surface 44B is established, the outer surface 42A, 42B, 42C and fifth surface 44B are blended with a blend radius equal to the second radius R to create the second blending surface 46B.

Although the steps of the algorithm 24 are described with respect to a flange-to-flange type joint 16 in FIG. 8, the algorithm 24 would carry out these steps in designing any of the types of joints set forth in FIGS. 4-7. Additional steps would be carried out to complete the geometry of the other types of joints, but the steps described above are the steps determinative of the smallest perceived gap 20.

As an alternative option to design the first and second flanges of the first and second vehicle components, and achieve the same geometry of the first and second components as in the method described above, the sketch operator could be used. Using the sketch operator on a datum plane, the two-dimensional lines and curves will be developed. All of these two-dimensional lines and curves are connected to each other by geometric and dimensional constraints. In order to have the true lengths for the first and second flanges of the first and second vehicle components, the datum plane must be perpendicular on the "cut line".

Referring to FIG. 9, the steps to create the sketch are indicated in progression from the predetermined curve 48 coincident with the outer surface (represented in two-dimension as outer surface curve 42A, 42B, 42C) from A to L. To design the first vehicle component 12, the method includes creating a datum plane 100, which must be perpendicular anywhere along the curve 48 coincident with the outer surface. Second, using this datum plane 100, the outer surface 42A, 42B, 42C will be sectioned resulting in the outer surface curve 42A, 42B, 42C. Also, the predetermined curve 48 coincident with the outer surface will be sectioned with the datum plane 100, resulting in point A. Third, the outer surface curve 42A, 42B, 42C will then be trimmed with this point A. Fourth, the remaining left side of the outer surface curve 42A, 42B, 42C will be trimmed at point B again in such a way that the total length will be equal with the first radius r, which is represented in FIG. 9 by the curved segment 80. Fifth, the segment A to B is extended by creating a line segment 82 of length r perpendicular to the outer surface curve 42A, 42B, 42C and extending from an end of the curved segment 80 (i.e., line segment B to C). Sixth, a line segment 84 of length l is then created at angle with the line segment 82 (i.e., line segment C to D), the angle having the value:

$$180-\epsilon-\delta.$$

A seventh line segment 86 of length r is created perpendicular to the end of line segment 84 (i.e., line segment D to E). An eighth line segment 88 of length 2l is created extending back toward the outer surface 42A, 42B, 42C from the end of line segment 86 (i.e., line segment E to F).

To design the second vehicle component 14, the first five steps (i.e., creation of line segments 80, 82) used to design the first vehicle component 12 are also utilized to begin the sketch of the second vehicle component 14. Next a line segment 90 of length L is created (i.e. line segment C to G) extending from the end of line segment 82 at angle with respect to line segment 82 of:

$$180-\epsilon.$$

A line segment 92 with a length:

$$r+G$$

is then created perpendicular from the line segment 90 (i.e., line segment G to H). A line segment 94 of length 2L is then created (i.e., line segment H to I) perpendicular to the line segment 92. The line segments 88, 94 of the lengths 2l and 2L are then swept along the cut line 48 (i.e., extended into and out of the page perpendicular to the two-dimensional figure in FIG. 9), maintaining the same relative angle to the outer surface 42A, 42B, 42C as established in the two-dimensional sketch. Blend radii of r and R, respectively, are used to blend the resulting first and second flanges surfaces (represented by 90, 94) with the outer surface) as indicated at 96 and 98 (i.e., blend J to B and blend K to L).

While the best modes for carrying out the invention have been described in detail, those familiar with the art to which this invention relates will recognize various alternative designs and embodiments for practicing the invention within the scope of the appended claims.

The invention claimed is:

1. A method comprising:
designing a first vehicle component and a second vehicle component by:
selecting input values for a first radius (r) of a first portion of a first vehicle component, a second radius (R) of a first portion of a second vehicle component, a minimum clearance (C) between the first and second vehicle components at a distal end of a flange portion of the first vehicle component extending from the first portion of the first vehicle component, wherein the distal end is remote from the first portion of the first component, a length (l) for the flange portion, and a gap (G) between the first and second vehicle components;
wherein the first and second vehicle components are partially defined by geometric characteristics of a predetermined outer surface; wherein a predetermined curve is coincident with the outer surface;
calculating a first angle of the flange portion of the first vehicle component relative to a line perpendicular to the outer surface based on at least some of the selected input values and geometric characteristics;
calculating a second angle of a flange portion of the second vehicle component relative to a line perpendicular to the outer surface based on at least some of the selected input values and geometric characteristics; wherein the flange portion of the second vehicle component extends from the first portion of the second vehicle component; wherein the calculated angles are configured to minimize a distance between the first and second vehicle components on the outer surface at which the first portions of the first and second vehicle components are tangent to the outer surface and converge at the respective radii toward the gap (G);
manufacturing the first vehicle component such that the flange portion of the first vehicle component is at the first angle determined by said calculating the first angle; and
manufacturing the second vehicle component such that the flange portion of the second vehicle component is at the second angle determined by said calculating the second angle.

2. The method of claim 1, wherein the first angle is:

$$180-\arcsin((R-r)/(r+G+R))+\arctan(r/l)+\arcsin((r+G-C)/\sqrt{(l^2+r^2)}).$$

3. The method of claim 1, wherein the second angle ($\delta$) is:

$$180-\arcsin((R-r)/(r+G+R)).$$

4. The method of claim 1, wherein the first vehicle component and the second vehicle component form a joint at the gap; wherein the joint is one of a hem to a flange wall, a hem to another hem, a flange to another flange wall, a flange to a ditch, and a flange to a hem.

5. A method comprising:
designing a first vehicle component and a second vehicle component by:
selecting an outer surface, a curve coincident with the outer surface, a first radius (r) of a first portion of the first vehicle component, a second radius (R) of a first portion of the second vehicle component, the second radius being greater than the first radius, a first distance (G) of a required gap between the first and second vehicle components, a first length (l) of a second portion of the first vehicle component extending from the first portion of the first vehicle component, a required minimum clearance (C) between the second portion of the first vehicle component at a distal end thereof and the second vehicle component, wherein the distal end is remote from the first portion of the first component;
establishing a first offset curve at which a curvature of the first vehicle component changes by offsetting by the first radius (r) from the curve coincident with the outer surface along the outer surface;
determining a center of the first portion of the first vehicle component by extending a first line segment with a length equal to the value of the first radius (r) perpendicular to the outer surface at the first offset curve, with the end of the first line segment opposite the first offset curve being the center of the first portion of the first vehicle component;
extending a second line segment having the first length (l) from the center of the first portion of the first vehicle component at a first angle with respect to the first line segment, the first angle having a value:

$$180-\epsilon-\delta;$$

wherein $\epsilon$ has a value $\arcsin((R-r)/(r+G+R))$ and $\delta$ has a value $\arctan(r/l)-\arcsin((r+G-C)/\sqrt{(l^2+r^2)})$;

establishing a second portion of the first vehicle component parallel to the second line segment by offsetting from the second line segment by the first radius (r); and blending the first and second portions of the first vehicle component with a portion of a circle having the first radius (r) to thereby complete a design of the first vehicle component; and manufacturing the first vehicle component with the first portion and the second portion according to said designing.

6. The method of claim 5, further comprising:

extending a third line segment of length (L) from the center of the first portion of the first vehicle component at a second angle with respect to the first line segment, the second angle having a value:

$$180-\epsilon.$$

7. The method of claim 6, further comprising:

establishing a flange of the second vehicle component parallel to the third line segment by offsetting from the third line segment by a distance having a value:

$$r+G.$$

8. The method of claim 7, further comprising:

blending the flange of the second vehicle component with the outer surface with a portion of another circle having the second radius (R) to thereby complete a design of the second vehicle component;

manufacturing the second vehicle component having the design of the second vehicle component; and placing the first and second vehicle components adjacent one another such that the resulting distance between tangents of the first and second vehicle components with the outer surface is associated with a first geometric configuration of the first and second vehicle components determined by the selected values for the first radius (r), the second radius (R), the first distance (G) of the required minimum gap, the first length (l) of the second portion of the first vehicle component, and the required minimum clearance (C).

9. A method comprising:

receiving selected spatial data for an outer surface partially defined by first and second vehicle components, a predetermined curve coincident with the outer surface, a selected first radius (r) of a first portion of the first vehicle component, a second radius (R) of a first portion of the second vehicle component, the second radius being greater than the first radius, a required gap (G) between the first and second vehicle components, a first length (l) of a second portion of the first vehicle component extending from the first portion of the first vehicle component, a second length (L) of a second portion of the second vehicle component extending from the first portion of the second vehicle component, a required minimum clearance (C) between the second portion of the first vehicle component at a distal end thereof and the second vehicle component; wherein the distal end is remote from the first portion of the first component;

establishing a first offset curve by offsetting by the value of the first radius (r) from the predetermined curve coincident with the outer surface along the outer surface;

creating a first surface extending perpendicular to the outer surface at the first offset curve with a length equal to the first radius (r), with a center of the first portion of the first component being at a distal end of the first surface;

creating a second surface at a first angle to the first surface with the first length (l); wherein the first angle is:

$$180-\arcsin((R-r)/(r+G+R))+\arctan(r/l)+\arcsin((r+G-C)/\sqrt{l^2+r^2}));$$

creating a third surface with the first length (l) by offsetting the second surface by the first radius (r) parallel to the second surface;

blending the outer and third surfaces with a blend radius equal to the first radius (r) to thereby complete a design of the first component;

creating a fourth surface with the second length (L) through the center of the first portion of the first vehicle component at a second angle from the third surface; wherein the second angle is:

$$180-\arcsin((R-r)/(r+G+R));$$

creating a fifth surface parallel with the fourth surface with the second length (L) by offsetting by the sum of the first radius (r) and the the required gap (G) from the fourth surface;

blending the outer and fifth surfaces with a blend radius equal to the second radius R to thereby complete a design of the second vehicle component;

manufacturing the first vehicle component according to the design of the first vehicle component; and manufacturing the second vehicle component according to the design of the second vehicle component.

10. A method comprising:

designing first and second vehicle components by:

selecting input values for a first radius (r) of a first portion of the first vehicle component, a second radius (R) of a first portion of the second vehicle component, a minimum clearance (C) between the first and second vehicle components at a distal end of a flange of the first vehicle component extending from the first portion of the first vehicle component, wherein the distal end is remote from the first portion of the first component, and a gap (G) between the first and second vehicle components;

creating a datum plane perpendicular to a predetermined curve coincident with a preselected outer surface;

sectioning the outer surface to establish an outer surface curve;

sectioning the predetermined curve with the datum plane to establish a point;

trimming the outer surface curve with the point;

trimming the outer surface curve to establish a curved segment with a length of the first radius (r);

extending a second line segment of length equal to the first radius (r) perpendicular to the outer surface curve from an end of the outer surface curve;

establishing a third line segment of length (l) at a first angle with the second line segment, the first angle having the value:

$$180-\epsilon-\delta;$$

wherein ϵ has a value $\arcsin((R-r)/(r+G+R))$ and δ has a value $\arctan(r/l)-\arcsin((r+G-C)/\sqrt{l^2+r^2}));$ establishing a fourth line segment of length equal to the first radius (r) perpendicular to a distal end of the third line segment;

extending a fifth line segment of length (2l) toward the outer surface curve from an end of the fourth line segment;

extending a sixth line segment of length (L) at the end of the second line segment sketched at a second angle with respect to the second line segment, the second angle having a value of:

$180-\epsilon$;

establishing a seventh line segment perpendicular to the sixth line segment, the seventh line segment having a length that is a sum of the first radius (r) and the required gap (G):

$r+G$; and establishing an eighth line segment of length (2L) perpendicular to the seventh line segment;

manufacturing the first vehicle component according to said designing; and manufacturing the second vehicle component according to said designing.

11. The method of claim 10, further comprising:

extending the fifth and eighth line segments along the outer surface while maintaining established relative distances and angles with respect to the predetermined curve.

12. The method of claim 10, further comprising:

blending the fifth and eighth line segments with the outer surface using blend radii of first radius (r) to blend the fifth line segment with the outer surface and of second radius (R) to blend the eighth line segment with the outer surface.

* * * * *